US011289515B2

(12) United States Patent
Nakayama et al.

(10) Patent No.: US 11,289,515 B2
(45) Date of Patent: Mar. 29, 2022

(54) DISPLAY DEVICE HAVING EXTERNAL CONNECTION TERMINAL

(71) Applicant: SHARP KABUSHIKI KAISHA, Sakai (JP)

(72) Inventors: Masaki Nakayama, Sakai (JP); Gen Nagaoka, Sakai (JP); Takashi Matsui, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 50 days.

(21) Appl. No.: 16/618,058

(22) PCT Filed: May 28, 2018

(86) PCT No.: PCT/JP2018/020406
§ 371 (c)(1),
(2) Date: Nov. 27, 2019

(87) PCT Pub. No.: WO2018/221467
PCT Pub. Date: Dec. 6, 2018

(65) Prior Publication Data
US 2021/0134839 A1 May 6, 2021

(30) Foreign Application Priority Data
Jun. 2, 2017 (JP) .............................. JP2017-110468

(51) Int. Cl.
*G09G 5/00* (2006.01)
*H01L 27/12* (2006.01)
*G09G 3/20* (2006.01)

(52) U.S. Cl.
CPC ............. *H01L 27/124* (2013.01); *G09G 3/20* (2013.01); *G09G 2300/0426* (2013.01)

(58) Field of Classification Search
CPC ........ G02F 1/137; G02F 1/133; G02F 1/1335; H01L 27/124; G09G 3/20;
(Continued)

(56) References Cited
U.S. PATENT DOCUMENTS

2003/0071943 A1* 4/2003 Choo ................. G02F 1/133514
349/106
2004/0239837 A1* 12/2004 Hong ................. G02F 1/133514
349/106
(Continued)

FOREIGN PATENT DOCUMENTS

WO 2016/080290 A1 5/2016

*Primary Examiner* — Pegeman Karimi
(74) *Attorney, Agent, or Firm* — ScienBiziP, P.C.

(57) ABSTRACT

For the purpose of changing, in an external connection terminal of a display device that transmits a plurality of polarities of the image signals, the positions of pairs of electrodes to which signals of different polarities are applied, a display device includes a display area having a plurality of pixels, a wiring area in which a plurality of wires corresponding to the plurality of pixels are arranged, and an external connection terminal having a plurality of electrodes to which image signals to be transmitted to the plurality of wires are applied. In the display device, polarities of the image signals transmitted to wires adjacent to each other among the plurality of wires are different from each other in the display area. In the display device, the order of arrangement of the plurality of electrodes is different from the order of the image signals transmitted to the plurality of wires of the display area.

17 Claims, 19 Drawing Sheets

(58) Field of Classification Search
CPC .... G09G 2300/0426; G09G 3/30; G09G 3/32; G09G 3/34; G09G 3/36; G09G 5/00
See application file for complete search history.

(56) References Cited

U.S. PATENT DOCUMENTS

2011/0169792 A1* 7/2011 Shimizu ................ G02F 1/1309
345/204
2017/0336688 A1 11/2017 Yamamoto et al.

* cited by examiner

FIG. 18
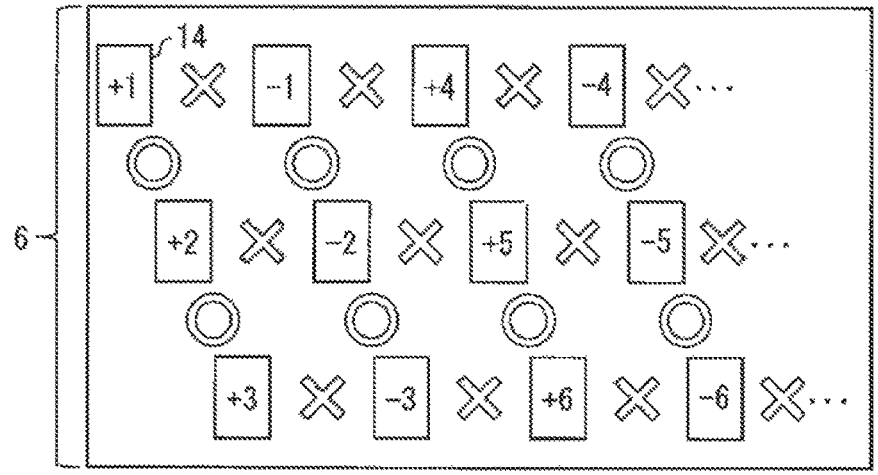
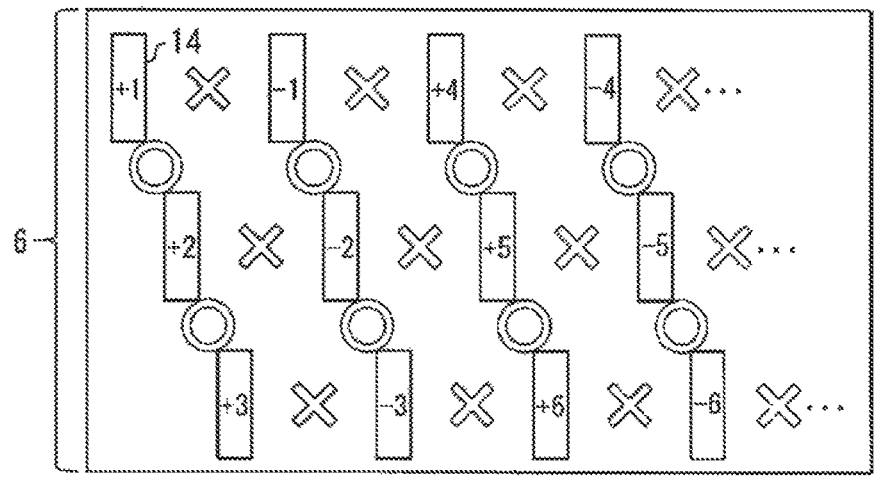
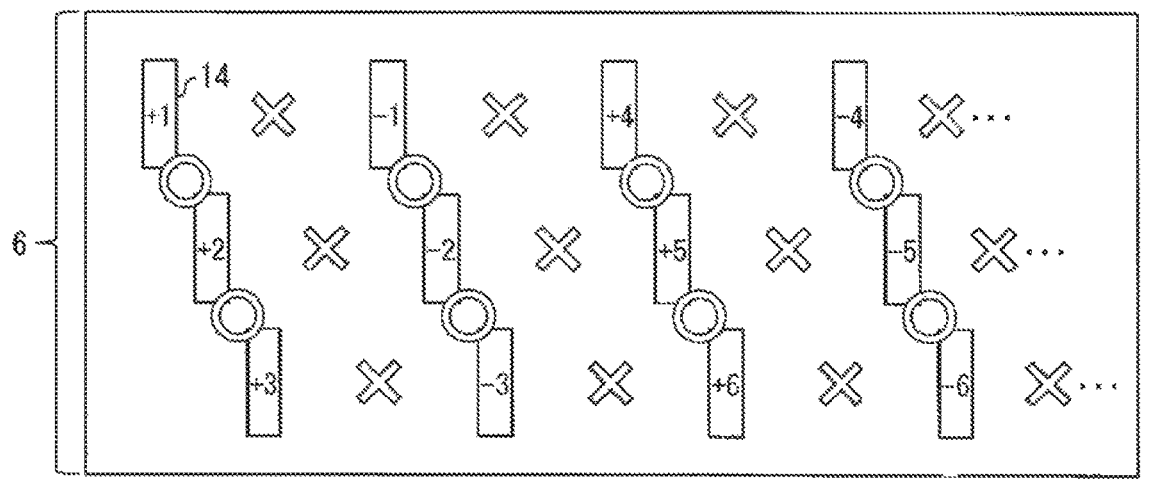

FIG. 19 DISPLAY DEVICE ACCORDING TO COMPARATIVE EXAMPLE

DISPLAY DEVICE HAVING EXTERNAL CONNECTION TERMINAL

TECHNICAL FIELD

The disclosure relates to a display device.

BACKGROUND ART

PTL 1 describes means for reducing the bias of polarities of image signals with respect to individual layers in a display device having a multi-layered wiring structure between external connection terminals and a display area on a panel substrate.

CITATION LIST

Patent Literature

PTL 1: International application publication pamphlet "International Publication No. WO2016/080290A1 (published on May 26, 2016)"

SUMMARY

Technical Problem

The inventors have found that, when signals of different polarities are applied respectively to adjacent different electrodes of external connection terminals, leakage occurs between the electrodes. Thus, depending on the design of external connection terminals, when image signals are transmitted to electrodes to follow the order of arrangement of the electrodes, leakage is highly likely to occur between the electrodes in some cases.

Solution to Problem

To address the problem described above, a display device according to one aspect of the disclosure includes a display area having a plurality of pixels, a wiring area in which a plurality of wires corresponding to the plurality of pixels are arranged, and an external connection terminal having a plurality of electrodes to Which image signals to be transmitted to the plurality of wires are applied. In the display device, polarities of the image signals transmitted to wires adjacent to each other among the plurality of wires are different from each other in the display area. In the display device, the order of arrangement of the plurality of electrodes is different from the order of the image signals transmitted to the plurality of wires of the display area.

Advantageous Effects of Disclosure

According to one aspect of the disclosure, in the external connection terminal, it is possible to change the positions of pairs of electrodes to which signals of different polarities are applied. As a result, depending on the design of the external connection terminal, image signals can be transmitted so as to reduce the possibility that leakage current occurs.

BRIEF DESCRIPTION OF DRAWINGS

FIG. 18 provides schematic diagrams for explaining the shape of electrode and a method of arranging electrodes of an external connection terminal of a display device according to Embodiment 6 of the disclosure.

DESCRIPTION OF EMBODIMENTS

Embodiment 1

Figure 1:
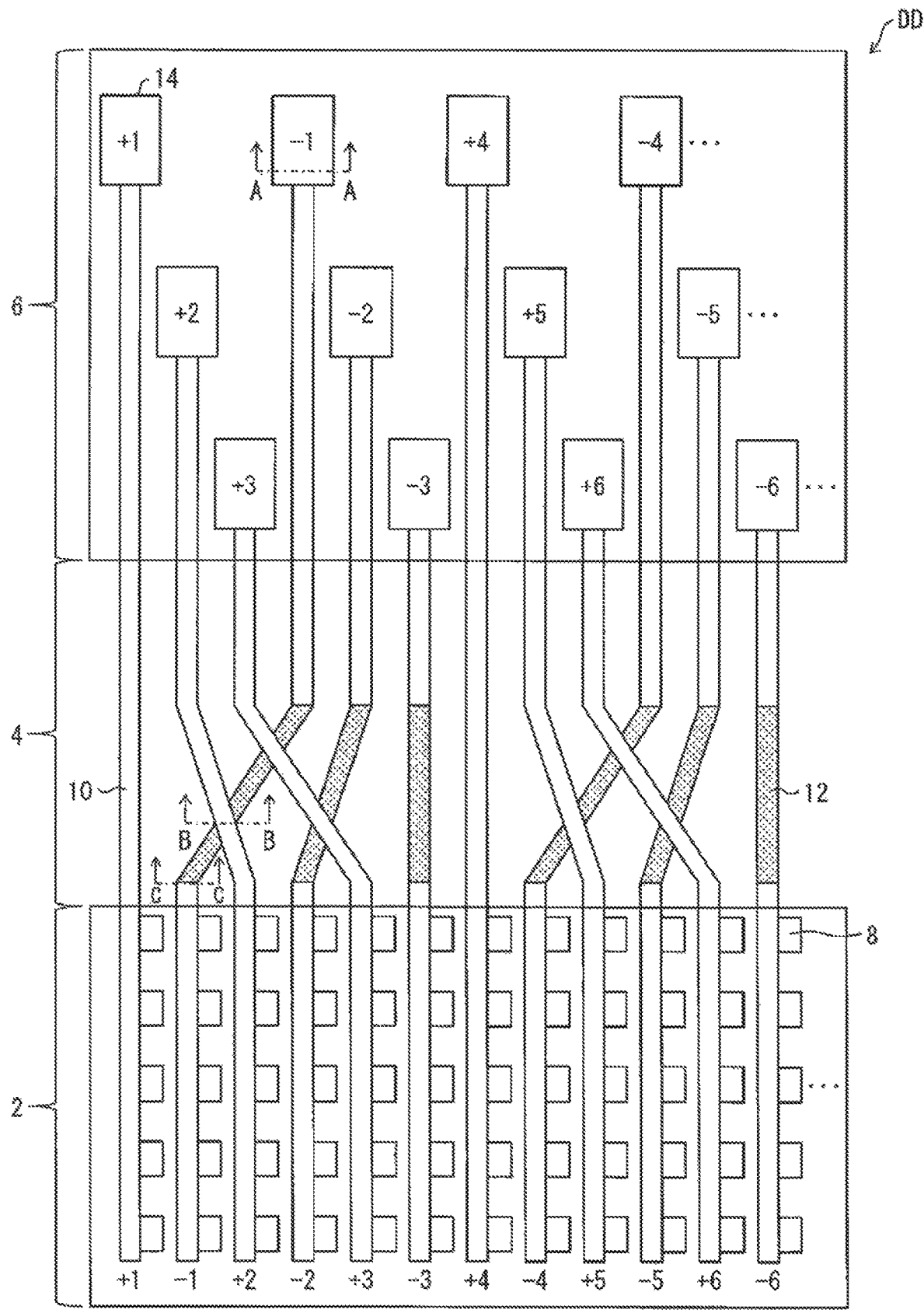
FIG. 1 is a schematic diagram of a display device according to Embodiment 1 of the disclosure for explaining a wiring structure of the display device and a method of applying image signals.

FIG. 1 is a schematic diagram of a display device DD according to Embodiment 1 of the disclosure for explaining a wiring structure of the display device DD and a method of applying image signals. It should be noted that, for the purpose of indicating individual members, the illustration of other members of the display device DD is omitted in FIG. 1 as appropriate and FIG. 1 illustrates the display device DD in a transparent manner as the display device DD is viewed from a top surface. In this specification, a longitudinal direction denotes a direction in which a wire coupled with an electrode extends and a transverse direction denotes a direction transverse to the wire.

As illustrated in FIG. 1, the display device DD includes a display area 2, a wiring area 4, and an external connection terminal 6. The display area 2 has a plurality of pixels 8 formed with transistors, such as TFTs, that are not illustrated in the drawing. In the wiring area 4, a plurality of wires corresponding respectively to the plurality of pixels 8 are arranged. The plurality of wires includes a first wire 10 and a second wire 12. The external connection terminal 6 includes a plurality of electrodes 14 to which image signals to be transmitted to the plurality of wires are applied. The plurality of electrodes 14 are coupled respectively to the plurality of wires.

Numerals with signs in FIG. 1 denote kinds of image signals transmitted to the plurality of electrodes, the plurality of wires, and the plurality of pixels. The numerals assigned to the electrodes 14 correspond to the numerals indicated at the bottom of the display area 2. The sign indicates the polarity of transmitted image signal: a plus sign indicates an image signal of positive polarity; and a minus sign indicates an image signal of negative polarity. The display device according to this embodiment performs displaying by employing column inversion driving, which is to apply image signals to the electrodes 14 such that the polarities of the image signals transmitted to wires adjacent to each other in the display area 2 are different from each other.

In this embodiment, the electrodes 14 are arranged at the external connection terminal 6 in a staggered arrangement of an odd number of levels, specifically three levels. That is to say, the electrodes 14 are arranged at three levels in the longitudinal direction and spaced apart from each other in the transverse direction not to be positioned in an overlapping manner in the longitudinal direction.

Figure 2:
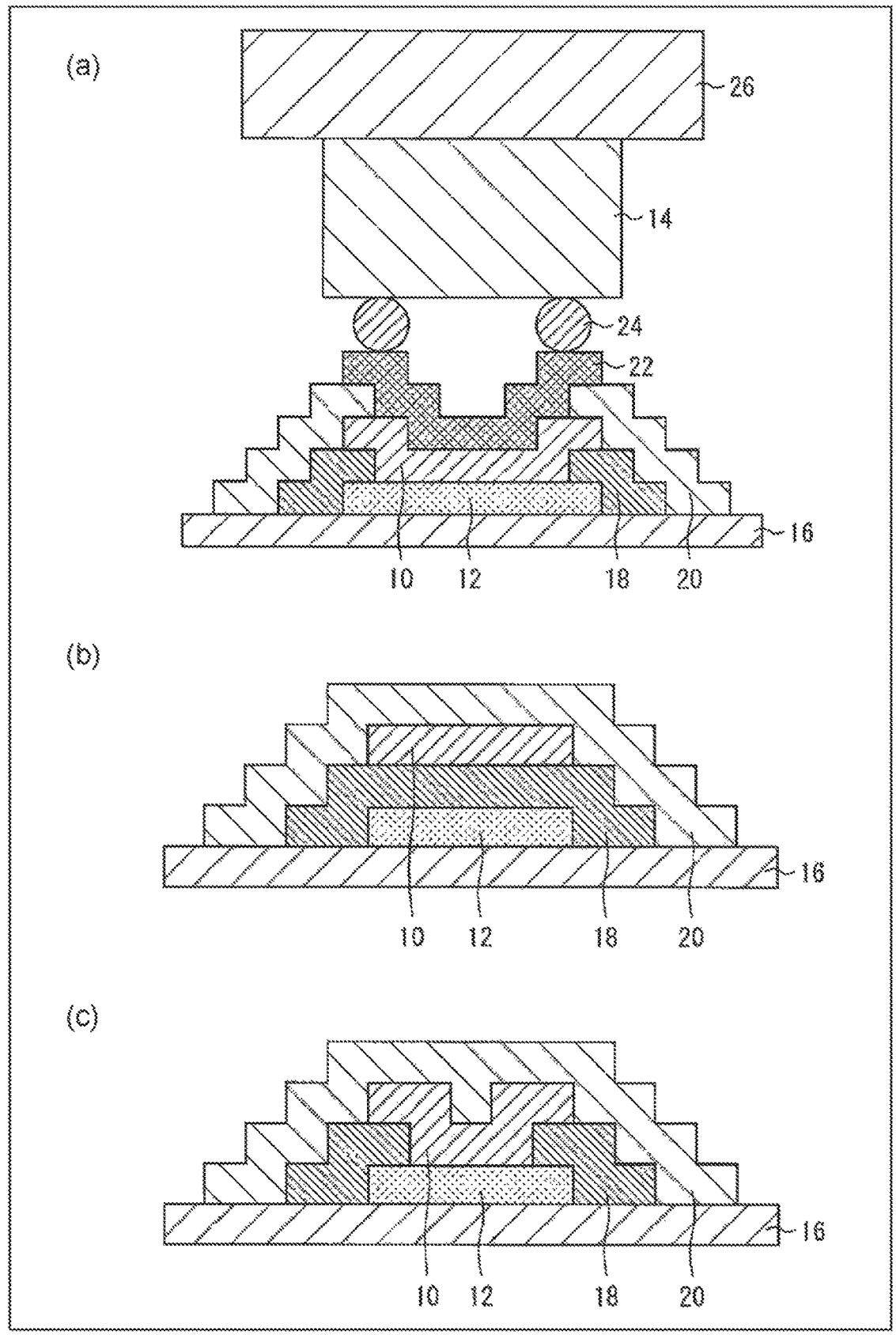
FIG. 2 provides schematic diagrams each illustrating a cross section of a particular part of wiring in FIG. 1.

FIG. 2(a) is a sectional view illustrating a detailed structure of the electrode 14 and members around the electrode 14. FIG. 2(a) is a sectional view taken along a line A-A in FIG. 1. A panel substrate 16 is positioned under the electrode 14. On the panel substrate 16, in the order starting from the bottom layer, the second wire 12, a first insulating layer 18, the first wire 10, a second insulating layer 20, and a conductive layer 22 are formed. The second wire 12, the first wire 10, and the conductive layer 22 establish electrical communication with each other.

The electrode 14 and the conductive layer 22 are electrically coupled to each other by means of conductive particles 24.

The electrode 14 is formed at a mounting substrate 26 and applied image signals from the mounting substrate 26. The image signals applied to the electrodes 14 are in turn transmitted to the first wire 10 and the second wire 12 via the conductive particles 24 and the conductive layer 22. The conductive layer 22 may be a transparent conductive layer, such as ITO. The conductive particles 24 may be, for example, metal particles contained in an anisotropic conductive film. In addition, the mounting substrate 26 may be, for example, a flexible printed circuit board.

Referring back to FIG. 1, in this embodiment, among the plurality of electrodes 14 of the external connection terminal 6, concerning at least one group of electrodes 14 adjacent to each other, the polarities of applied image signals are identical to each other. Here, a pair of adjacent electrodes of one group may denote a pair consisting of one electrode 14 and another electrode 14 of electrodes 14 that is closest to the one electrode 14 and that is formed at a different position in a direction in which wires extend. Alternatively, a pair of adjacent electrodes of one group may denote a pair consisting of one electrode 14 and another electrode 14 of electrodes 14 that is closest to the one electrode 14 and that is formed at an identical position in the direction in which wires extend.

In the display device DD according to this embodiment, the order of arrangement of the plurality of electrodes 14 differs from the order of image signals transmitted to the plurality of wires of the display area 2; in other words, image signals are applied to the electrodes 14 in an order different from the order of arrangement of the electrodes 14.

In this embodiment, among the electrodes 14 arranged in a staggered arrangement of three levels, the polarities of image signals applied to particular electrodes 14 aligned with respect to the longitudinal direction are identical to each other. For example, to two electrodes 14 arranged in a column identical to that of one electrode 14 to which an image signal +1 is applied, image signals +2 and +3 are respectively applied. Similarly, to two electrodes 14 arranged in a column identical to that of one electrode 14 to which an image signal −1 is applied, image signals −2 and −3 are respectively applied.

Thus, with respect to the longitudinal direction, regarding a pair composed of one electrode 14 to which the image signal +1 is applied and another electrode 14 adjacent to the one electrode 14, the polarities of applied image signals are both positive. The same holds for other electrodes and image signals of identical polarities are applied to a pair of electrodes adjacent to each other in the longitudinal direction.

In this embodiment, while the method of applying image signals is as described above, wires are routed in the wiring area 4 such that the polarities of image signals transmitted to wires adjacent to each other in the display area 2 are different from each other. For example, to position a wire to which the image signal −1 is transmitted in the external connection terminal 6 at a position in the display area 2 adjacent to a wire to which the image signal +1 is transmitted, the wire to which the image signal −1 is transmitted is routed in the wiring area 4. Specifically, in the wiring area 4, the wire to which the image signal −1 is transmitted crosses both a wire to which the image signal +2 is transmitted and a wire to which the image signal +3 is transmitted.

In this embodiment, in the wiring area, wires to which image signals of positive polarity are transmitted are all formed of the first wire 10. By contrast, in the wiring area, wires to which image signals of negative polarity are transmitted are formed of both the first wire 10 and the second wire 12. Particularly, at a position at which a wire to which an image signal of positive polarity is transmitted and another wire to which an image signal of negative polarity is transmitted cross each other, the wire to which an image signal of positive polarity is transmitted is constituted by the first wire 10, whereas the other wire to which an image signal of negative polarity is transmitted is constituted by both the first wire 10 and the second wire 12 in a different layer. Here, "different layer" denotes that both are produced in different processes.

FIG. 2(b) provides a sectional view taken along a line B-B in FIG. 1, that is, a sectional view at a position of the wiring area 4 at which the wire to which the image signal −1 is transmitted and the wire to which the image signal +2 is transmitted cross each other. As illustrated in FIG. 2(b), the first insulating layer 18 is formed between the second wire 12 serving as a lower layer and the first wire 10 serving as an upper layer. As a result, the second wire 12 and the first wire 10 are electrically isolated from each other. Furthermore, the second insulating layer 20 is formed as an upper layer on the first wire 10 and the top portion of the first wire 10 is electrically isolated from the outside of the second insulating layer 20.

FIG. 2(c) provides a sectional view taken along a line C-C in FIG. 1, that is, a sectional view at a position of the wiring area 4 at which the wire to which the image signal −1 is transmitted is connected to a wire formed in the display area 2. As illustrated in FIG. 2(c), the first insulating layer 18 is not formed between the second wire 12 serving as a lower layer and the first wire 10 serving as an upper layer. As a result, the second wire 12 and the first wire 10 establish electrical communication with each other. Also at this position, the second insulating layer 20 is formed as an upper layer on the first wire 10 and the top portion of the first wire 10 is electrically isolated from the outside of the second insulating layer 20.

At the position at which a wire to which an image signal of positive polarity is transmitted and another wire to which an image signal of negative polarity is transmitted cross each other, the wires to which image signals of different polarities are transmitted are positioned at different layers, and as a result, it is possible to improve the isolation between wires to which image signals of different polarities are respectively transmitted.

In addition, the first wire 10 may be in the same layer as the layer of gate electrodes of transistors in the display area 2 and the second wire 12 may be in the same layer as the layer of source electrodes of the transistors in the display area 2. This enables the first wire 10 and the second wire 12 to be installed at the same time as transistors are formed. Here, "same layer" denotes that both are produced in the same process.

Figure 19:
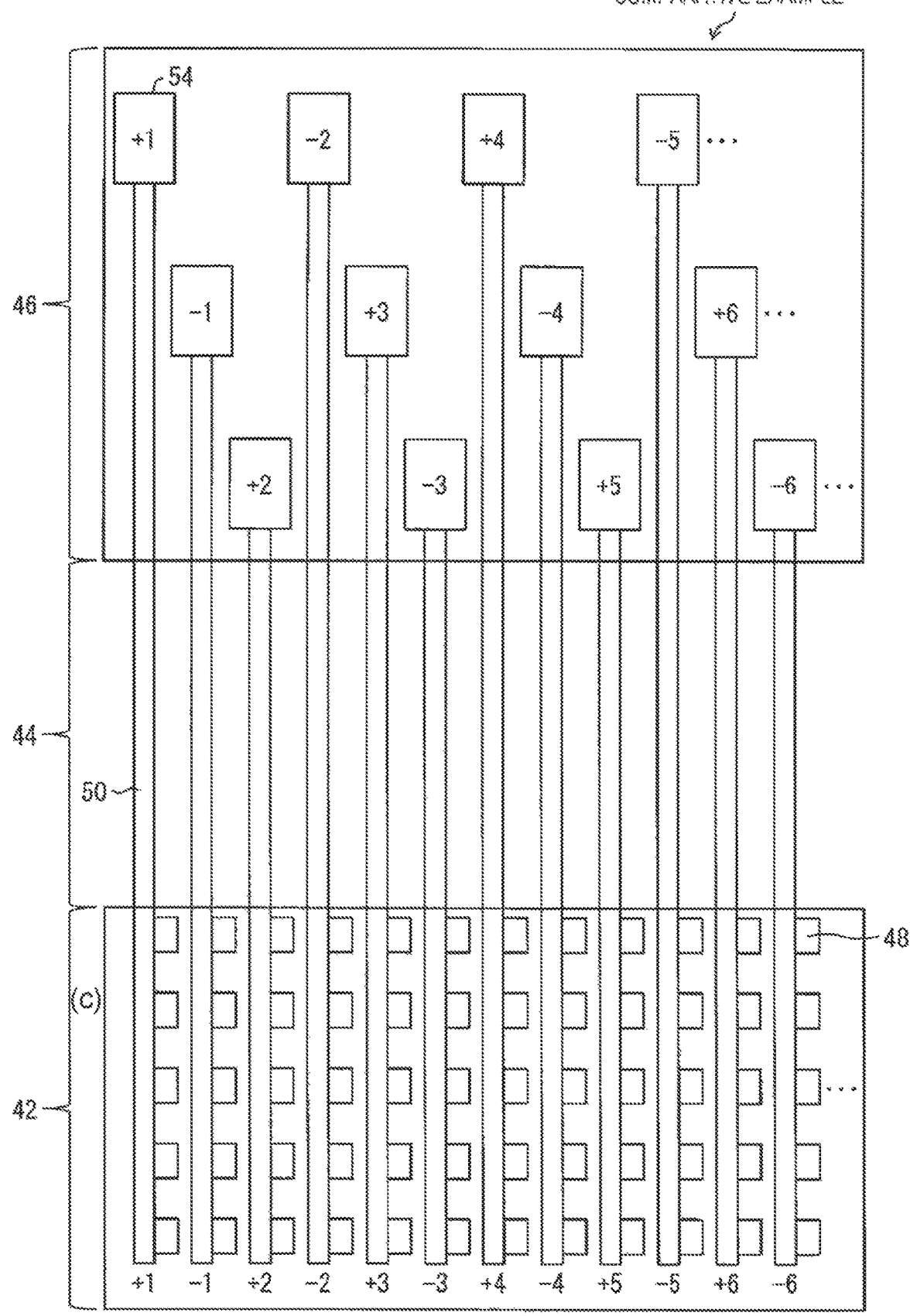
FIG. 19 is a schematic diagram of a display device according to a comparative example of the disclosure for explaining a wiring structure of the display device and a method of applying image signals.
Figure 20:
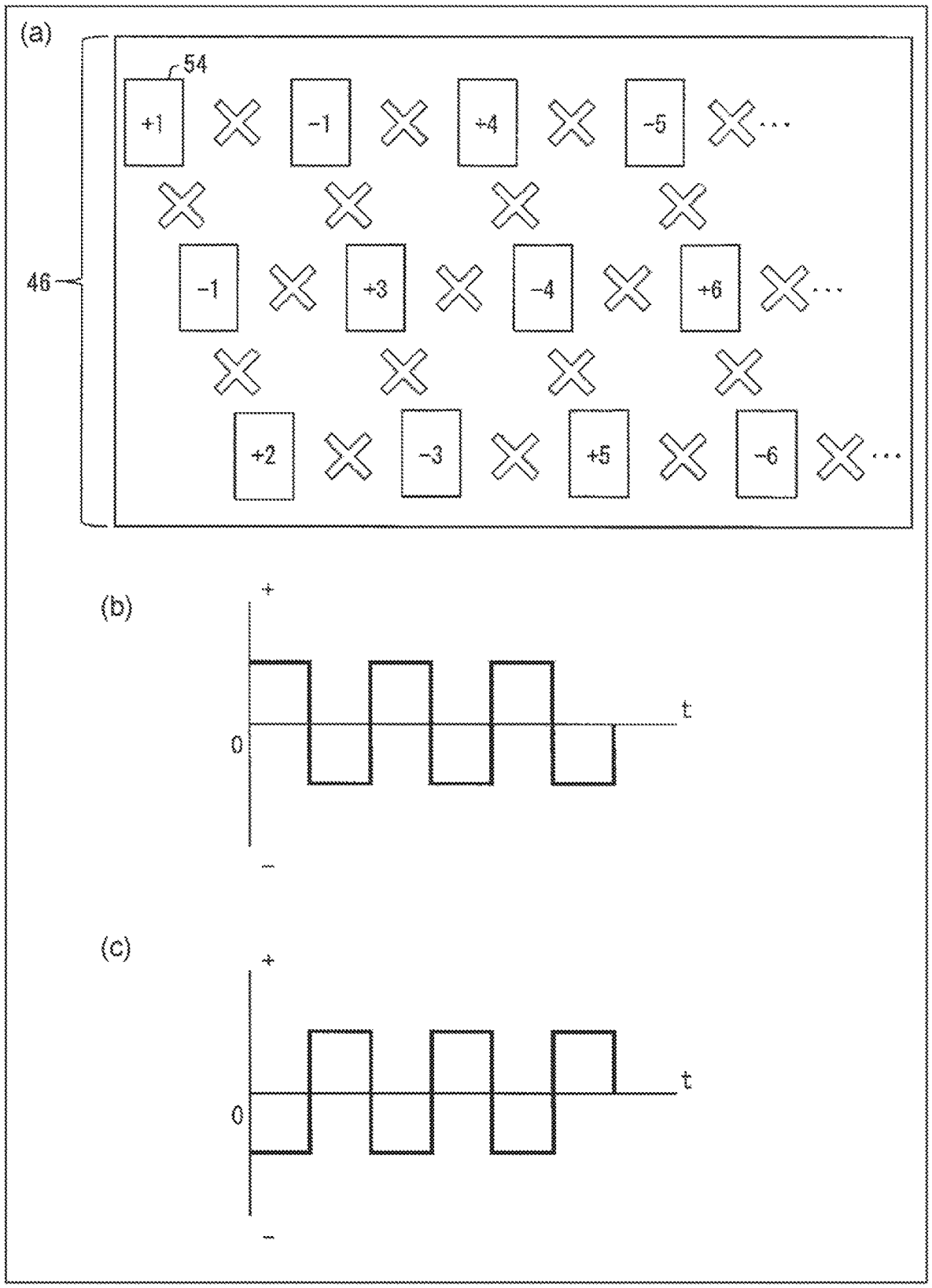
FIG. 20 is a diagram for explaining problems of the display device according to the comparative example.

Here, by explaining a display device according to a comparative example with reference to FIGS. 19 and 20, technical problems to be solved by the disclosure is described.

FIG. 19 is a schematic diagram of the display device according to the comparative example for explaining a wiring structure of the display device and a method of applying image signals. The display device according to the comparative example includes a display area 42, a wiring area 44, and an external connection terminal 46.

The display area 42 has a plurality of pixels 48 formed with transistors, such as TFTs, that are not illustrated in the drawing. In the wiring area 44, a plurality of wires corresponding respectively to the plurality of pixels 48 are arranged. The plurality of wires includes a first wire 50. The external connection terminal 46 includes a plurality of electrodes 54 to which image signals to be transmitted to the plurality of wires are applied. The plurality of electrodes 54 are coupled respectively to the plurality of wires.

In comparison to the display device DD according to the embodiment, in the display device according to the comparative example, wires do not cross each other in the wiring area 44 and image signals are transmitted directly in the order of arrangement of the electrodes. Thus, in the external connection terminal 46, image signals of different polarities are alternately applied to the electrodes 54 adjacent to each other in a manner such as +1, −1, +2, . . . .

As a result, as illustrated in FIG. 20(a), in the external connection terminal 46 of the display device according to the comparative example, image signals of different polarities are respectively applied to all pairs of electrodes adjacent to each other. Therefore, the different polarities may cause leakage current between a pair of electrodes.

Figure 3:
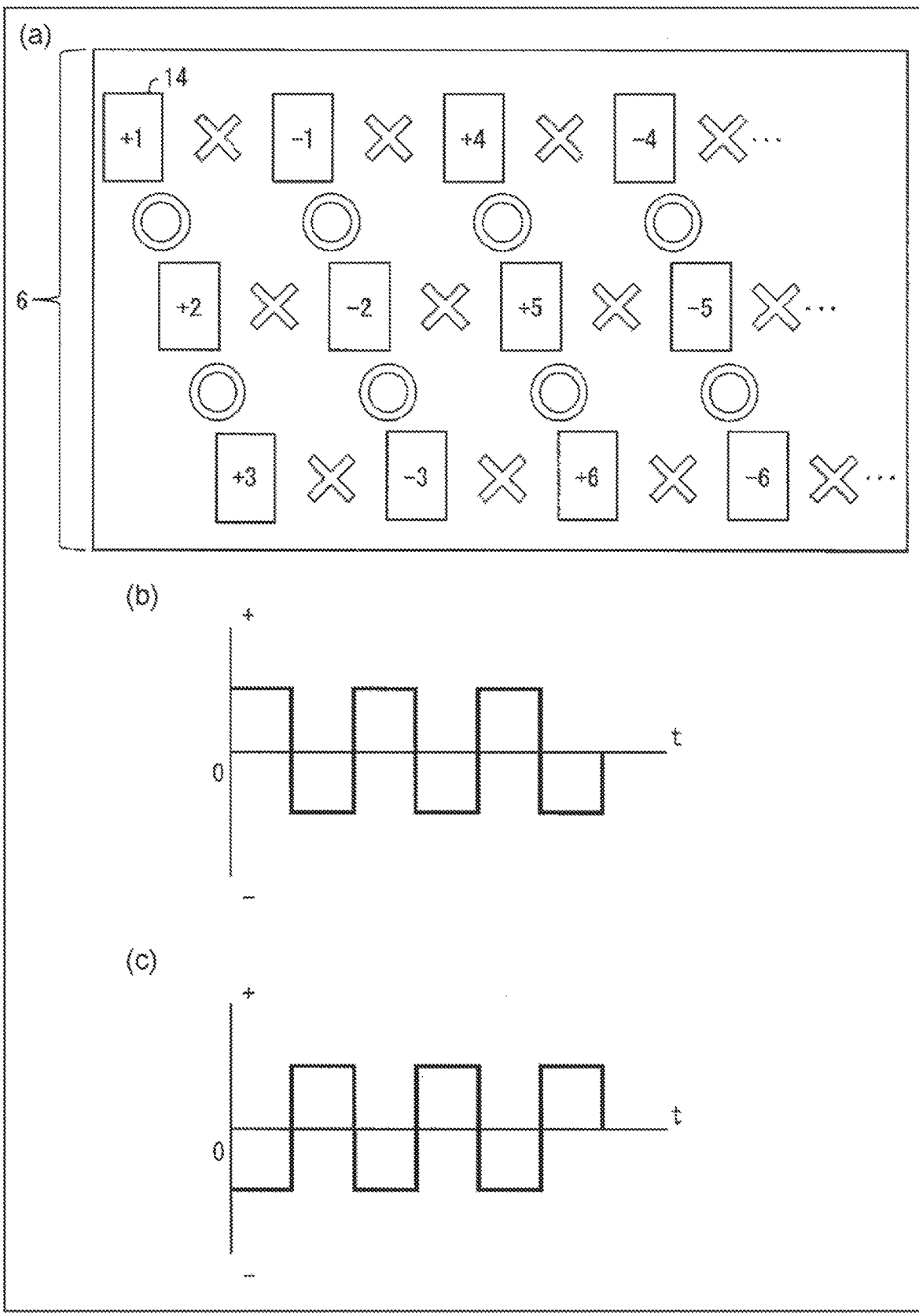
FIG. 3 provides diagrams for explaining image signals of the display device according to Embodiment 1 of the disclosure and effects achieved by the display device.

FIG. 3 provides diagrams for explaining effects achieved by the display device DD according to this embodiment. FIG. 3(a) illustrates a relationship of polarities of image signals transmitted to pairs of electrodes adjacent to each other in the external connection terminal 6 of the display device DD according to this embodiment. FIGS. 3(b) and 3(c) are graphs that respectively illustrate the signal strength of image signal of positive and negative polarities, in which the horizontal axis indicates time and the vertical axis indicates the signal strength, Specifically, image signals as illustrated in FIG. 3(b) are applied to the electrodes 14 each assigned a numeral with a plus sign in FIG. 3(a) while image signals as illustrated in FIG. 3(c) are applied to the electrodes 14 each assigned a numeral with a minus sign in FIG. 3(a).

In FIG. 3(a), when image signals of identical polarities are applied to a pair of electrodes adjacent to each other, a sign ○ is indicated between the pair of electrodes. By contrast, when image signals of different polarities are applied to a pair of electrodes adjacent to each other, a sign× is indicated between the pair of electrodes. In the display device DD according to this embodiment, the polarity of an image signal applied to one electrode 14 of the external connection terminal 6 is different from the polarity of an image signal applied to another electrode 14 adjacent to the one electrode in the transverse direction, while the polarity of the image signal applied to one electrode 14 of the external connection terminal 6 is identical to the polarity of an image signal applied to another electrode 14 adjacent to the one electrode in the longitudinal direction.

Thus, in the external connection terminal 6 of the display device DD according to this embodiment, the order of arrangement of the electrodes 14 differs from the order of image signals transmitted to the wires in the display area 2 and image signals of identical polarities are transmitted to a pair of electrodes adjacent to each other in the longitudinal direction. As a result, it is possible to reduce the possibility that leakage current is caused between electrodes by the different polarities. In this embodiment, the percentage of pairs of electrodes to which image signals of different polarities are transmitted can be decreased to approximately 60% of all pairs of electrodes.

While this embodiment uses the example in which the electrodes 14 are arranged in a staggered arrangement of three levels, the arrangement is not limited to this example; this embodiment may be applied to the case in which the electrodes 14 are arranged in a staggered arrangement of an odd number of levels, such as five, seven, or more levels. For example, in regard to the electrodes 14 arranged in a staggered arrangement of M levels, where M is a positive odd number, the percentage of pairs of electrodes to which image signals of different polarities are transmitted can be decreased to $M/(M+(M-1))$ of all pairs of electrodes.

Figure 4:
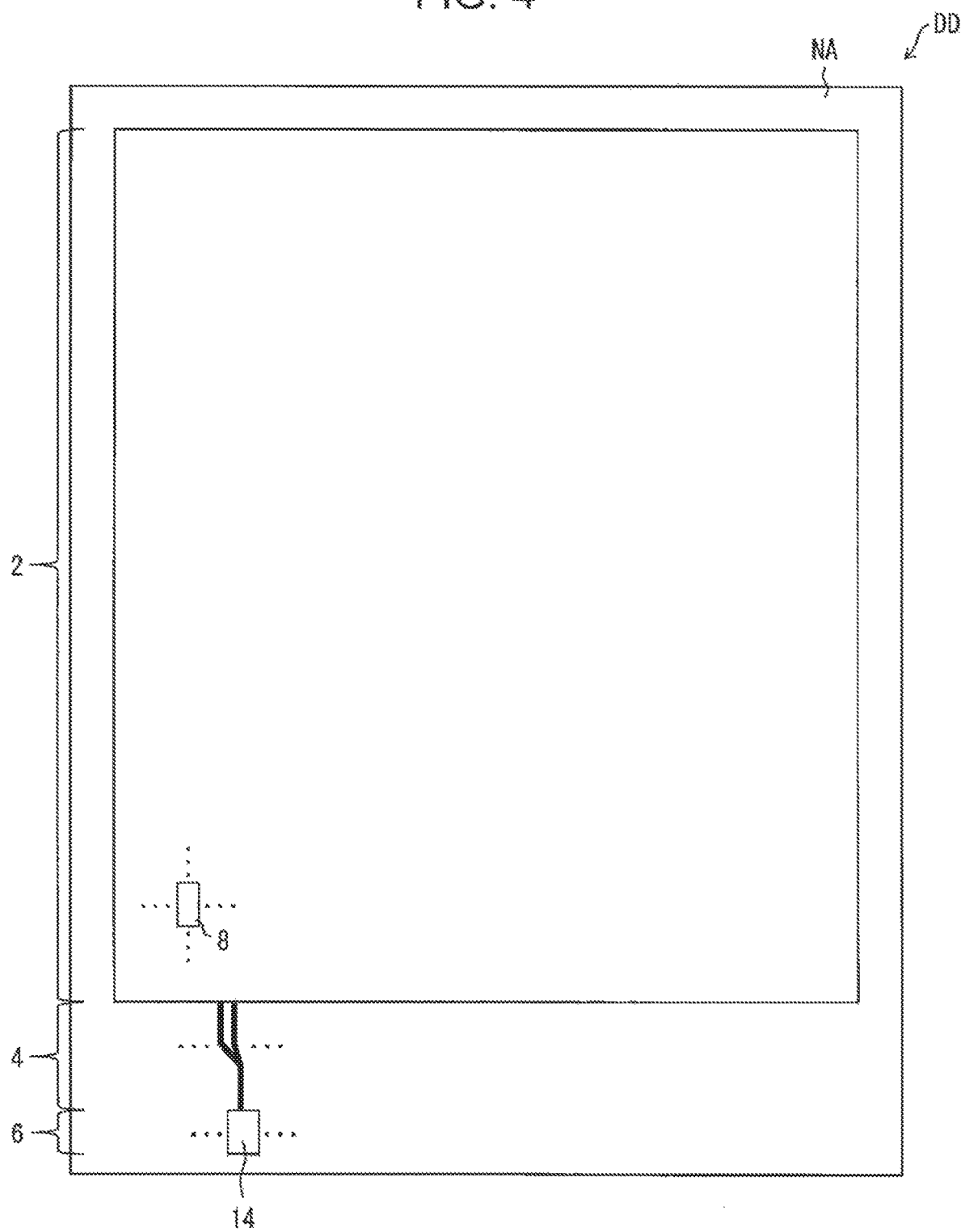
FIG. 4 is a schematic diagram of the display device according to Embodiment 1 of the disclosure.

FIG. 4 is a schematic diagram illustrating the top surface of the display device DD according to this embodiment. The display device DD has the display area 2 and a non-display area NA formed at the panel substrate. As illustrated in FIG. 4, the wiring area 4 and the external connection terminal 6 may be formed at the non-display area NA. The mounting substrate such as a flexible printed circuit board is provided for the external connection terminal 6. The external connection terminal 6 receives image signals from the mounting substrate and in turn transmits the image signals to the plurality of pixels 8 of the display area 2 through the wires arranged in the wiring area 4. In the display device DD according to this embodiment, for example, COG, COF-FOG, COP, COF-FOP, or OLB may be employed as a method of installing the external connection terminal 6.

Embodiment 2

Figure 5:
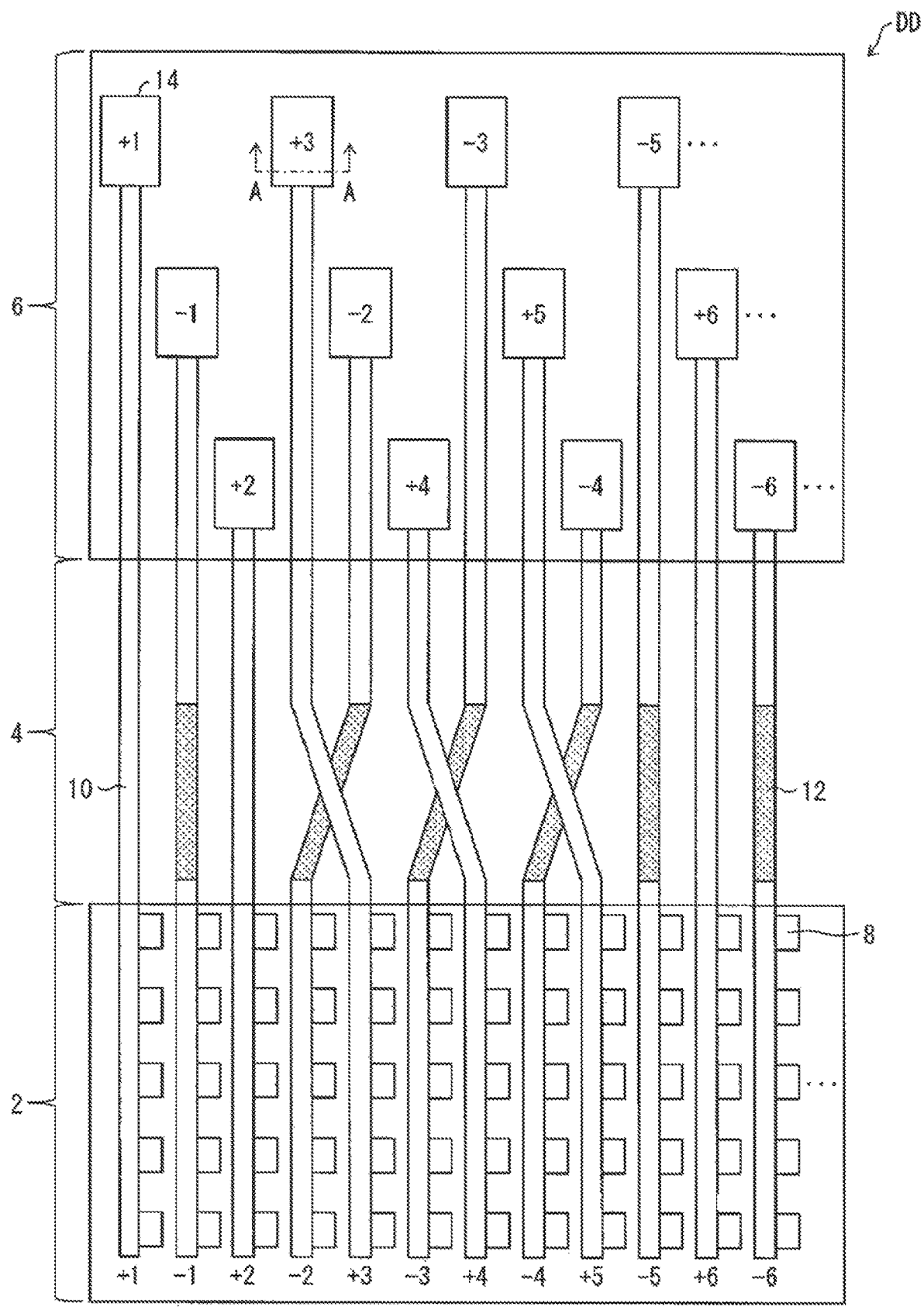
FIG. 5 is a schematic diagram of a display device according to Embodiment 2 of the disclosure for explaining a wiring structure of the display device and a method of applying image signals.

FIG. 5 is a schematic diagram of a display device DD according to Embodiment 2 of the disclosure, for explaining a wiring structure of the display device DD and a method of applying image signals. The display device DD according to this embodiment differs from the display device according to the previous embodiment in the order f image signals applied respectively to the electrodes 14.

In this embodiment, the order of applying image signals is determined such that image signals of identical polarities are applied repeatedly multiple times to a group of electrodes formed at positions identical to each other among the plurality of electrodes 14 with respect to the direction transverse wires. For example, as illustrated in FIG. 5, to the electrodes 14 at the topmost level, image signals of identical polarities are applied repeatedly twice in the order such as +1, +3, −3, −5, . . . . It should be noted that in this embodiment image signals of different polarities are applied to pairs of electrodes adjacent to each other in the longitudinal direction.

Also in this embodiment, similarly to the previous embodiment, while the method of applying image signals is as described above, wires are routed in the wiring area 4 such that the polarities of image signals transmitted to wires adjacent to each other in the display area 2 are different from each other. For example, to position a wire to which the image signal −2 is transmitted in the external connection terminal 6 at a position between wires to which the image signals +2 and +3 are transmitted in the display area 2, the wire to which the image signal −2 is transmitted is routed in the wiring area 4. Specifically, in the wiring area 4, the wire to which the image signal −2 is transmitted crosses the wire to which the image signal +3 is transmitted.

Figure 6:
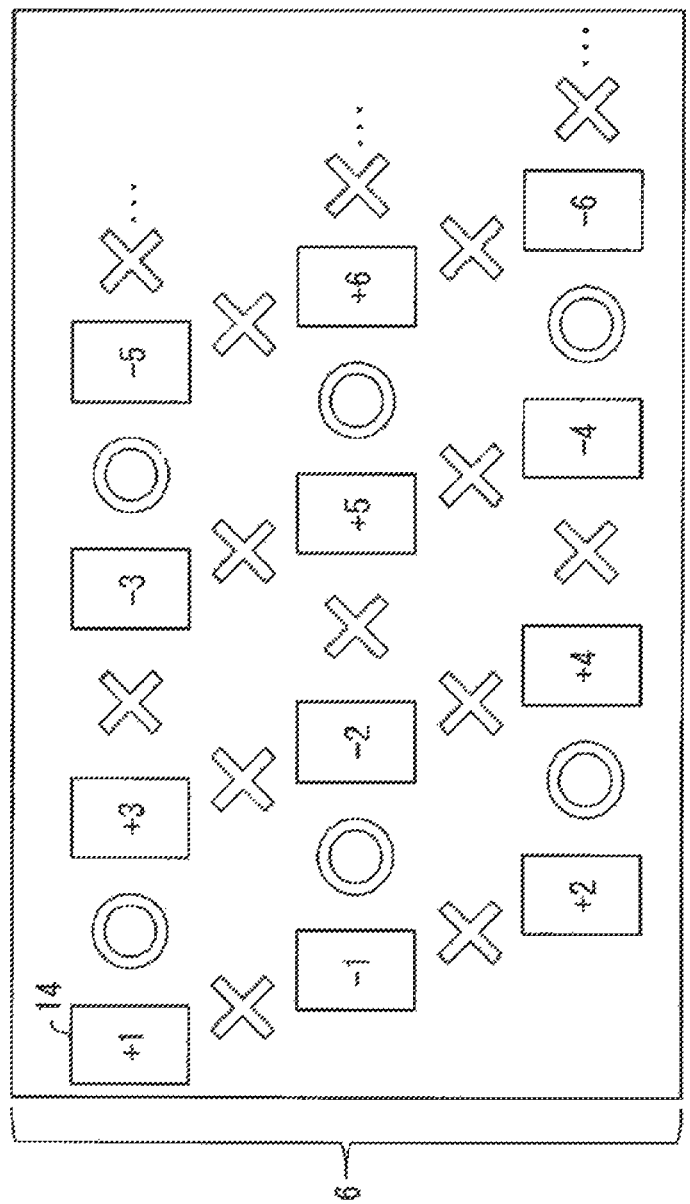
FIG. 6 is a diagram for explaining effects achieved by the display device according to Embodiment 2 of the disclosure.

FIG. 6 illustrates a relationship of polarities of image signals transmitted to pairs of electrodes adjacent to each other in the external connection terminal 6 of the display device DD according to this embodiment. As illustrated in FIG. 6, in this embodiment, the polarity of an image signal applied to one electrode 14 is different from the polarity of an image signal applied to another electrode 14 adjacent to the one electrode 14 in the longitudinal direction. However, the polarity of an image signal applied to one electrode 14 is identical to the polarity of an image signal applied to another electrode 14 that is adjacent, to the one electrode 14 in the transverse direction and to which an image signal of identical polarity is applied again.

As a result, since in the external connection terminal 6 of the display device DD according to this embodiment image signals of identical polarities are transmitted to pairs of electrodes that are adjacent to each other in the transverse direction and to which image signals of identical polarities are repeatedly applied, it is possible to reduce the possibility that leakage current is caused between electrodes by the different polarities. In this embodiment, the percentage of pairs of electrodes to which image signals of different polarities are transmitted can be decreased to approximately 70% of all pairs of electrodes.

Figure 7:
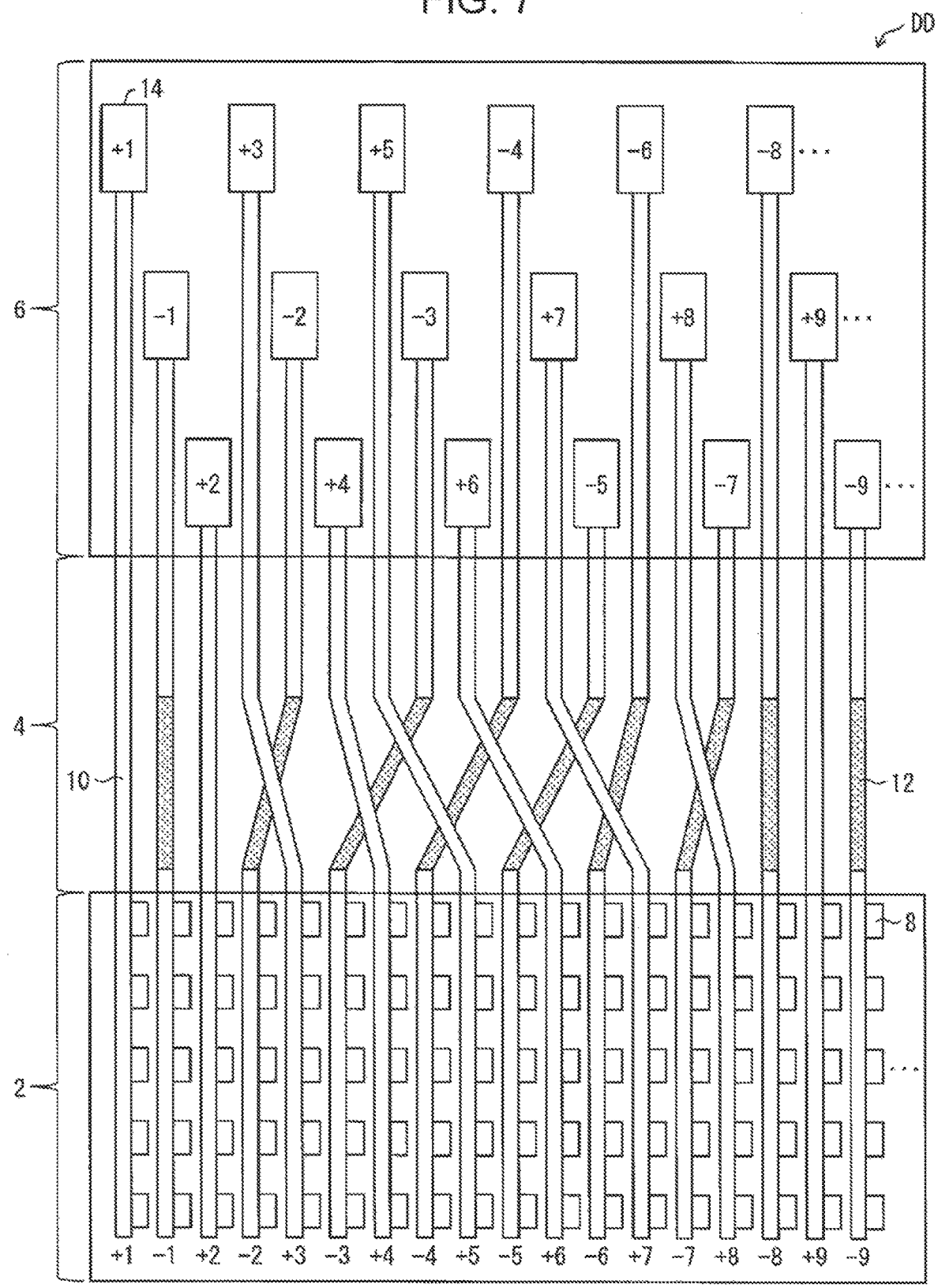
FIG. 7 is a schematic diagram of a display device according to another example of Embodiment 2 of the disclosure for explaining a wiring structure of the display device and a method of applying image signals.
Figure 8:
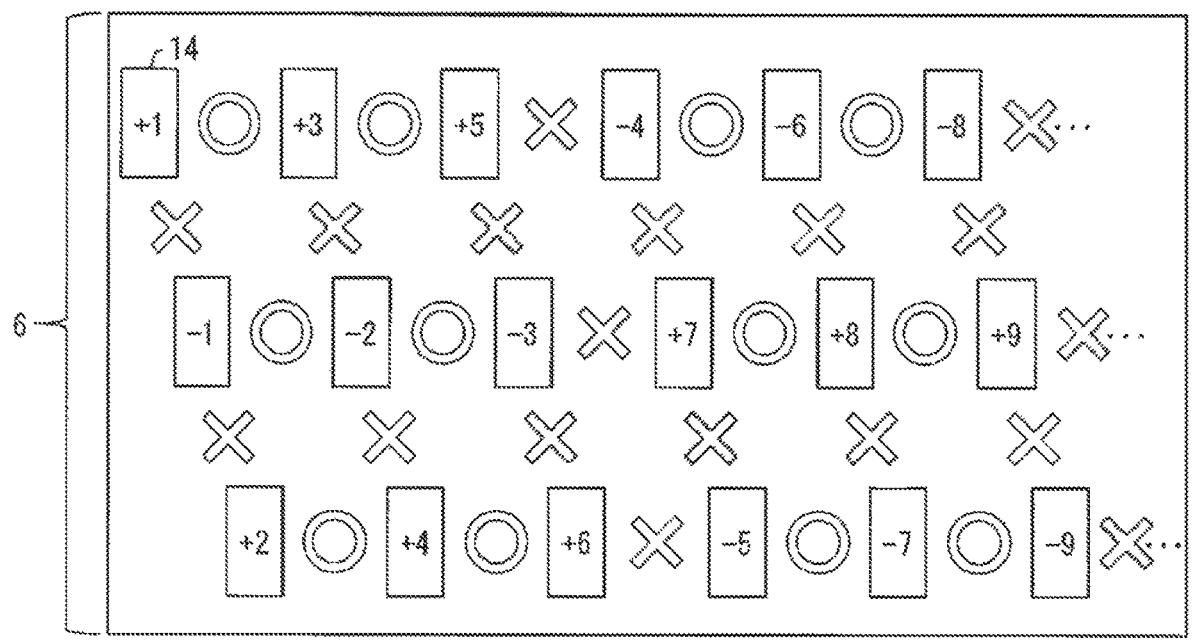
FIG. 8 is a diagram for explaining effects achieved by the display device according to the other example of Embodiment 2 of the disclosure.

While in this embodiment the number of repeat times indicating how many times image signals of identical polarities are repeatedly applied to the electrodes 14 at the same level is two, the number is not limited to this and this embodiment may be applied to the case in which the number of repeat times is three, four, or more. FIG. 7 is a schematic diagram of the display device DD for explaining a wiring structure of the display device DD and a method of applying image signals in the case in which the number of repeat times indicating how many times image signals of identical polarities are repeatedly applied is three. Also in this case, as illustrated in FIG. 8, since image signals of identical polarities are transmitted to pairs of electrodes that are adjacent to each other in the transverse direction and to which image signals of identical polarities are repeatedly applied, it is possible to reduce the possibility that leakage current is caused between electrodes by the different polarities.

By increasing the number of times indicating how many times image signals of identical polarities are repeatedly applied among the electrodes 14 at the same level, it is possible to substantially reduce the percentage of pairs of electrodes to which image signals of different polarities are transmitted with respect to all pairs of electrodes. For example, when N is the number of repeat times, in regard to the electrodes 14 arranged in a staggered arrangement of M levels, the percentage of pairs of electrodes to which image signals of different polarities are transmitted can be decreased to $2M/((2N \times M)+(2N \times (M-1)))$ of all pairs of electrodes.

Figure 9:
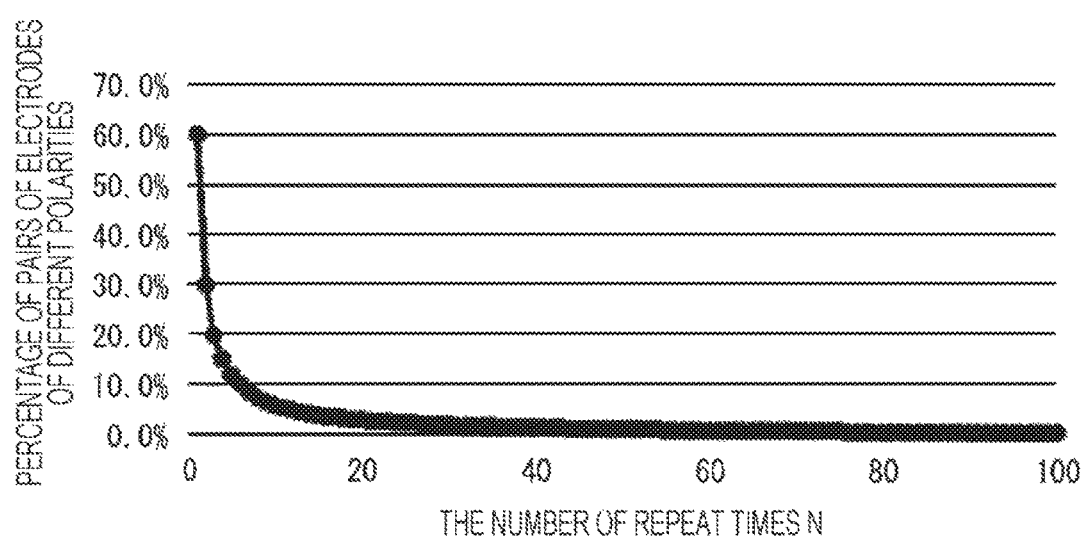
FIG. 9 is a graph illustrating a relationship between the number of repeat times to apply image signals of identical polarities to electrodes and the percentage of pairs of electrodes of different polarities in an external connection terminal.

FIG. 9 is a graph in which the vertical axis indicates the percentage of pairs of electrodes to which image signals of different polarities are transmitted with respect to all pairs of electrodes among the electrodes 14 arranged in a staggered arrangement of three levels and the horizontal axis indicates the number of repeat times N. As illustrated in FIG. 9, when the number of repeat times N is equal to or more than seven, the percentage of pairs of electrodes of different polarities is less than 10%. Similarly, when the number of repeat times N is equal to or more than 13, the percentage of pairs of electrodes of different polarities is less than 5%.

As compared to the previous embodiment, the display device DD according to this embodiment is effective in the case in which the distance between the electrodes 14 adjacent to each other in the external connection terminal 6 is closer in the transverse direction than the longitudinal direction.

Embodiment 3

Figure 10:
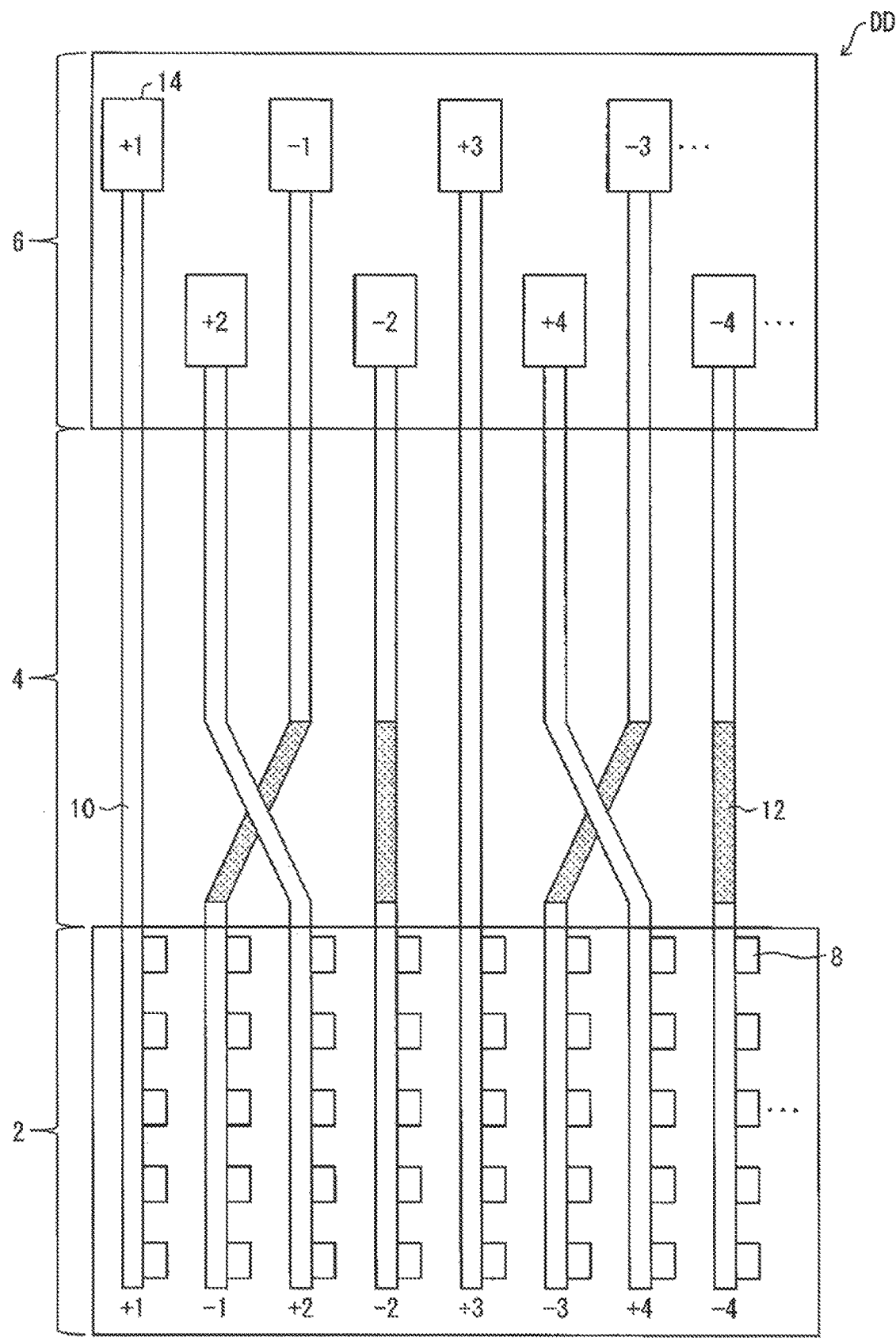
FIG. 10 is a schematic diagram of a display device according to Embodiment 3 of the disclosure for explaining a wiring structure of the display device and a method of applying image signals.

FIG. 10 is a schematic diagram of a display device DD according to Embodiment 3 of the disclosure for explaining a wiring structure of the display device DD and a method of applying image signals. The display device DD according to this embodiment differs from the display device DD according to Embodiment 1 in that the electrodes 14 are arranged in a staggered arrangement of two levels.

In this embodiment, among the electrodes 14 arranged in a staggered arrangement of two levels, the polarities of image signals applied to particular electrodes 14 aligned with respect to the longitudinal direction are identical to each other. For example, to one electrode 14 arranged in a column identical to that of another electrode 14 to which the image signal +1 is applied, the image signal +2 is applied. For example, to one electrode 14 arranged in a column identical to that of another electrode 14 to which the image signal −1 is applied, the image signal −2 is applied.

Thus, with respect to the longitudinal direction, regarding a pair composed of one electrode 14 to which the image signal +1 is applied and another electrode 14 adjacent to the one electrode 14, the polarities of applied image signals are both positive. The same holds for other electrodes and image signals of identical polarities are applied to a pair of electrodes adjacent to each other in the longitudinal direction.

In this embodiment, while the method of applying image signals is as described above, wires are routed in the wiring area 4 such that the polarities of image signals transmitted to wires adjacent to each other in the display area 2 are different from each other. For example, to position a wire to which the image signal −1 is transmitted in the external connection terminal 6 at a position in the display area 2 adjacent to a wire to which the image signal +1 is transmitted, the wire to which the image signal −1 is transmitted is routed in the wiring area 4. Specifically, in the wiring area 4, the wire to which the image signal −1 is transmitted crosses the wire to which the image signal +2 is transmitted.

Figure 11:
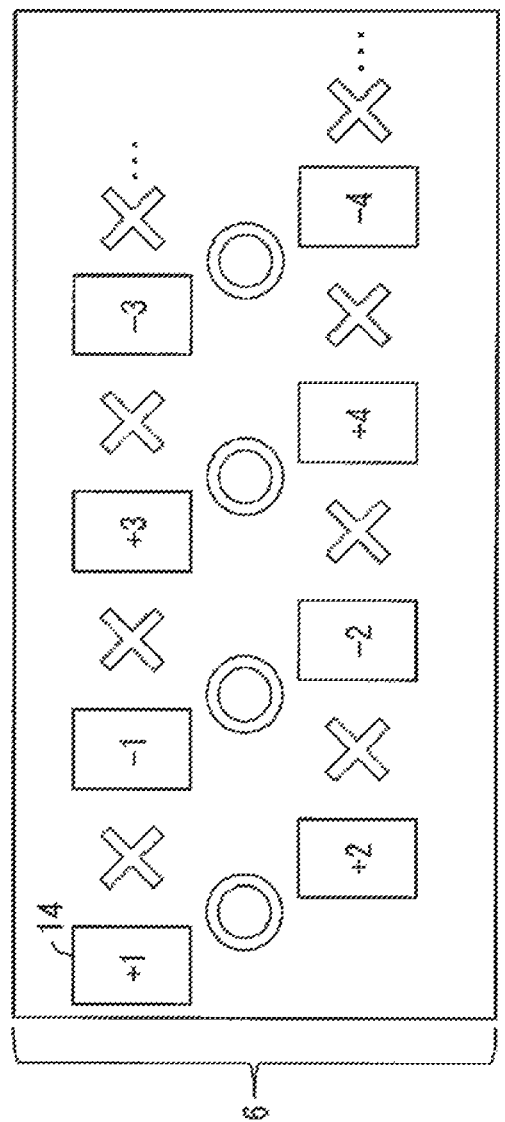
FIG. 11 is a diagram for explaining effects achieved by the display device according to Embodiment 3 of the disclosure.

FIG. 11 illustrates a relationship of polarities of image signals transmitted to pairs of electrodes adjacent to each other in the external connection terminal 6 of the display device DD according to this embodiment. As illustrated in FIG. 11, in this embodiment, the polarity of an image signal applied to one electrode 14 is different from the polarity of an image signal applied to another electrode 14 adjacent to the one electrode in the transverse direction, while the polarity of the image signal applied to one electrode 14 is identical to the polarity of an image signal applied to another electrode 14 adjacent to the one electrode in the longitudinal direction.

As a result, since in the external connection terminal 6 of the display device DD according to this embodiment image signals of identical polarities are transmitted to pairs of electrodes that are adjacent to each other in the longitudinal direction, it is possible to reduce the possibility that leakage current is caused between electrodes by the different polarities. In particular, as compared to the case in which the polarities of image signals applied to the electrodes 14 do not diverge, the display device DD according to this embodiment is effective in the case in which the distance between the electrodes 14 adjacent to each other in the external connection terminal 6 is closer in the longitudinal direction than the transverse direction.

Figure 12:
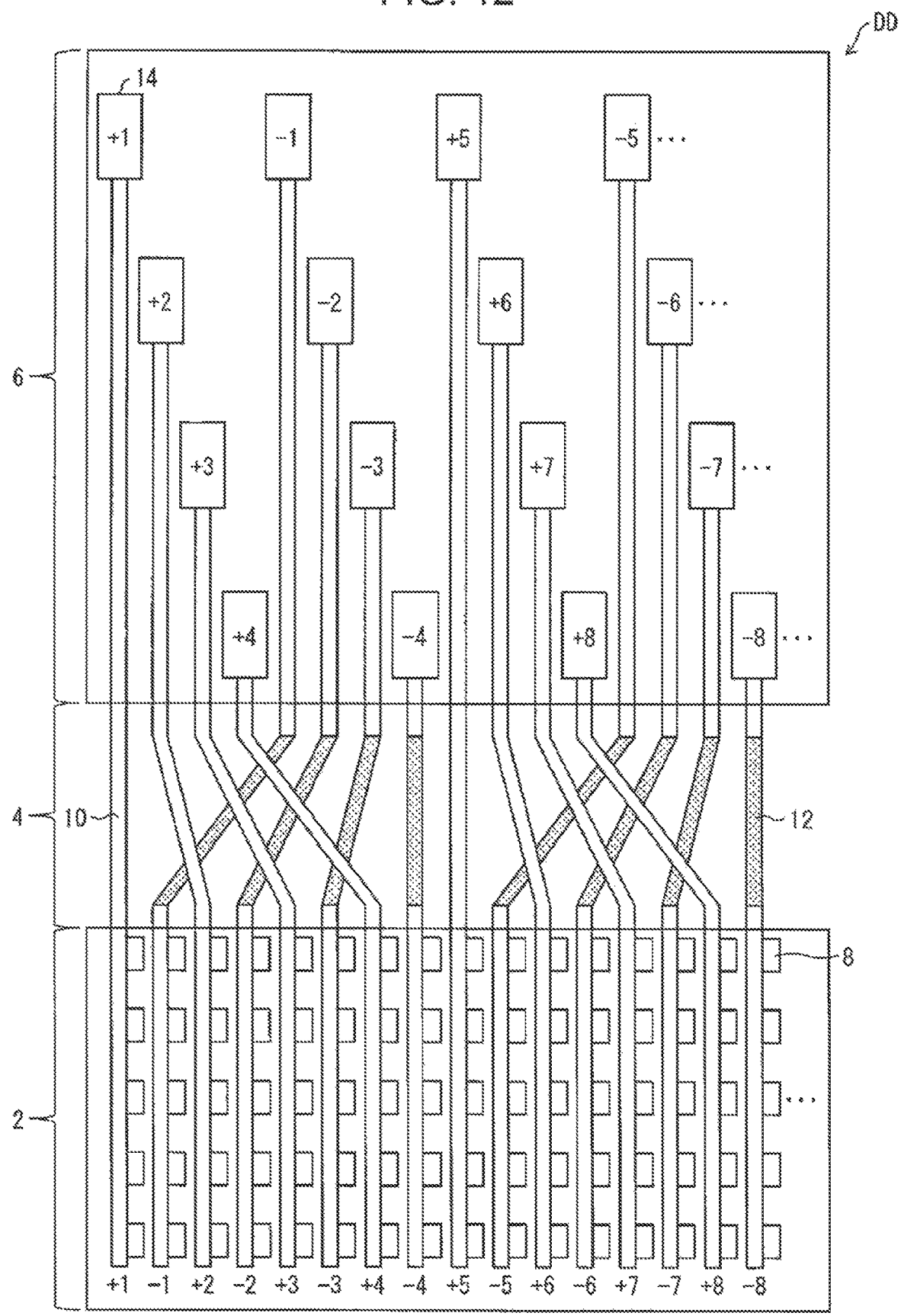
FIG. 12 is a schematic diagram of a display device according to another example of Embodiment 3 of the disclosure for explaining a wiring structure of the display device and a method of applying image signals.
Figure 13:
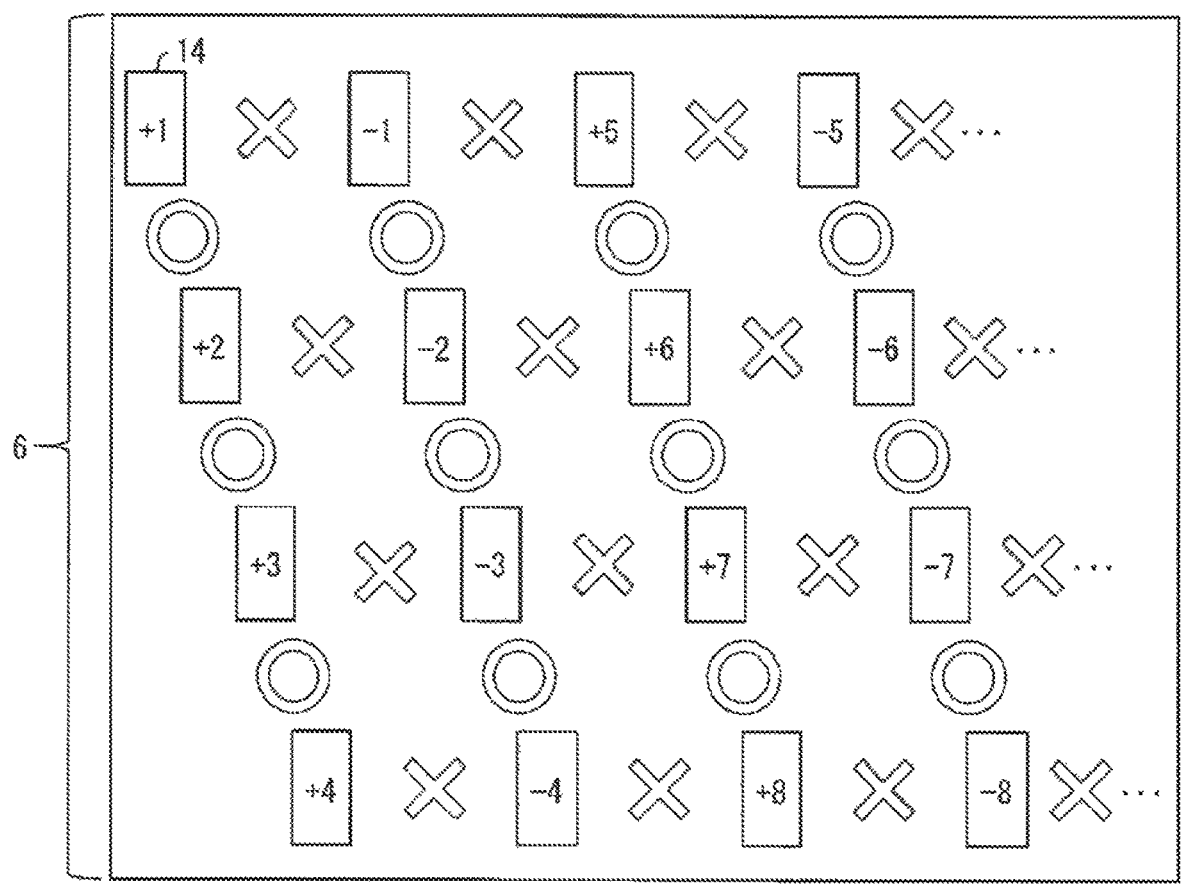
FIG. 13 is a diagram for explaining effects achieved by the display device according to the other example of Embodiment 3 of the disclosure.

While this embodiment uses the example in which the electrodes 14 are arranged in a staggered arrangement of two levels, the arrangement is not limited to this example; this embodiment may be applied to the case in which the electrodes 14 are arranged in a staggered arrangement of an even number of levels, such as four, six, or more levels. FIG. 12 illustrates the display device DD in which the electrodes 14 are arranged in a staggered arrangement of four levels. Also in this case, as illustrated in FIG. 13, since image signals of identical polarities are transmitted to pairs of electrodes adjacent to each other in the longitudinal direction, it is possible to reduce the possibility that leakage current is caused between electrodes by the different polarities.

Embodiment 4

Figure 14:
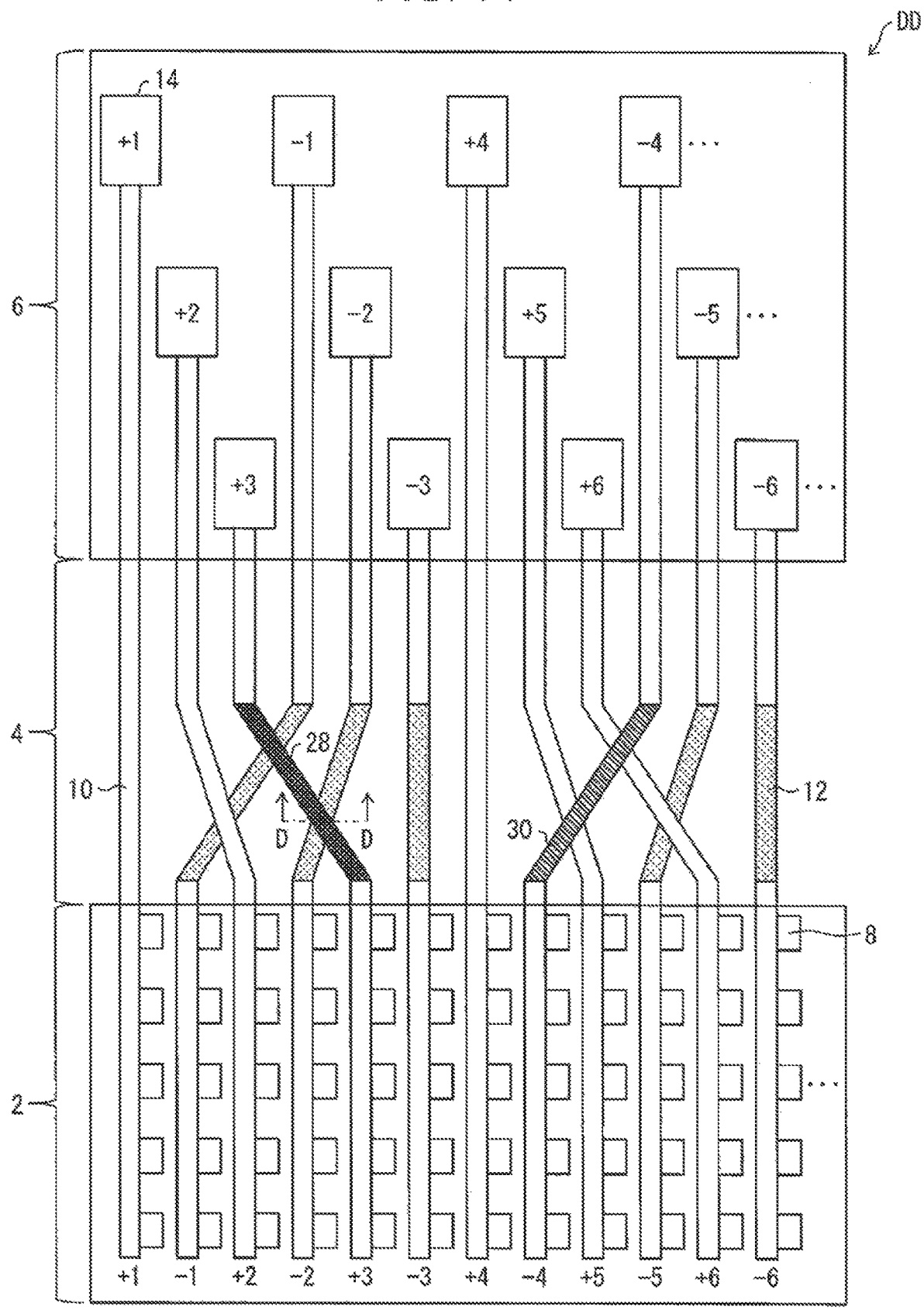
FIG. 14 is a schematic diagram of a display device according to Embodiment 4 of the disclosure for explaining a wiring structure of the display device and a method of applying image signals.

FIG. 14 is a schematic diagram of a display device DD according to Embodiment 4 of the disclosure for explaining a wiring structure of the display device DD and a method of applying image signals. The display device DD according to this embodiment differs from the display device DD according to Embodiment 1 in layers at which wires are formed in the wiring area 4.

The display device DD according to this embodiment further includes a third wire 28 and a fourth wire 30 in the wiring area 4. The third wire 28 is formed at positions at which the wire to which the image signal +3 is transmitted crosses the wires to which the image signals −1 and −2 are transmitted. The fourth wire 30 is formed at positions at which the wire to which the image signal −4 is transmitted crosses the wires to which image signals +5 and +6 are transmitted.

Figure 15:
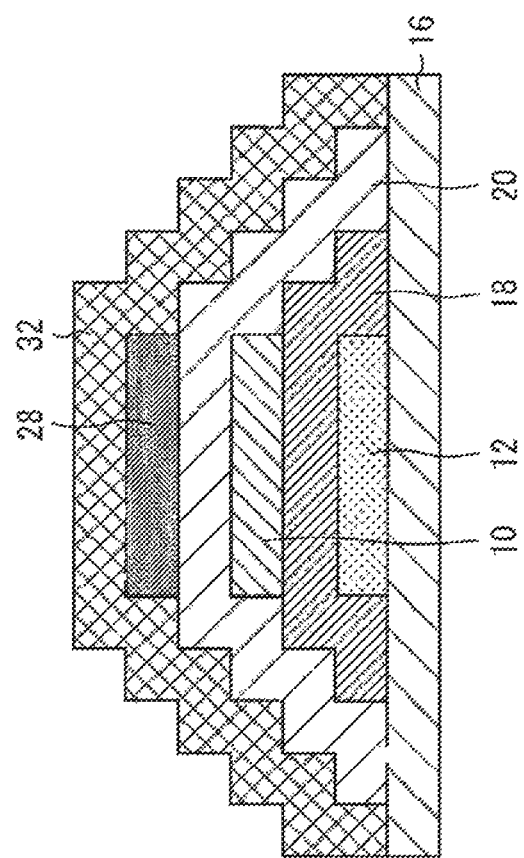
FIG. 15 is a schematic diagram illustrating a cross section of a particular part of wiring in FIG. 14.

FIG. 15 provides a sectional view taken along a line D-D in FIG. 14, that is, a sectional view at a position at which the third wire 28 crosses the second wire 12. The third wire 28 is electrically isolated from the first wire 10 by the second insulating layer 20. Furthermore, a third insulating layer 32 is formed as an upper layer on the third wire 28 and the top portion of the third wire 28 is electrically isolated from the outside of the third insulating layer 32. It should be noted that the structure at a position at which the fourth wire 30 crosses the first wire 10 may be identical to the structure described above.

In the display device DD according to this embodiment, a wire to which an image signal of one polarity is transmitted is formed in a different layer at a position at which the wire crosses another wire to which an image signal of the other polarity is transmitted. This can further improve the isolation between wires to which image signals of different polarities are respectively transmitted.

Figure 16:
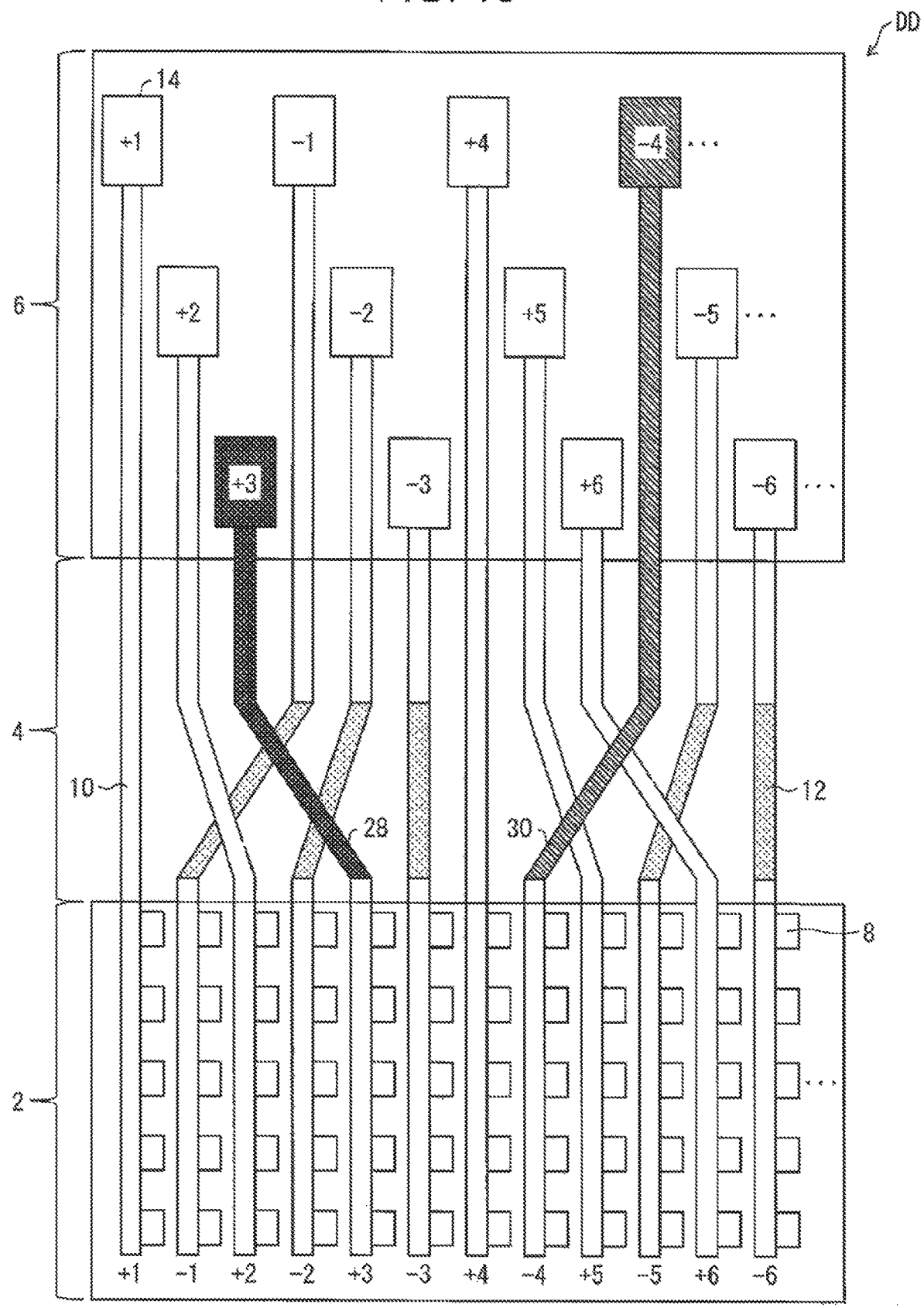
FIG. 16 is a schematic diagram of a display device according to another example of Embodiment 4 of the disclosure for explaining a wiring structure of the display device and a method of applying image signals.

This embodiment uses the example in which the third wire 28 and the fourth wire 30 are formed only in the wiring area 4. The structure is, however, not limited to the example, and as illustrated in FIG. 16, the wires, the electrodes 14, or both, which are in the external connection terminal 6 and coupled to the wires in the wiring area 4, may also be formed in a layer identical to the layer of the third wire 28 or the fourth wire 30. With this configuration, also in the external connection terminal 6, it is possible to improve the isolation between wires to which image signals of different polarities are respectively transmitted.

Embodiment 5

Figure 17:
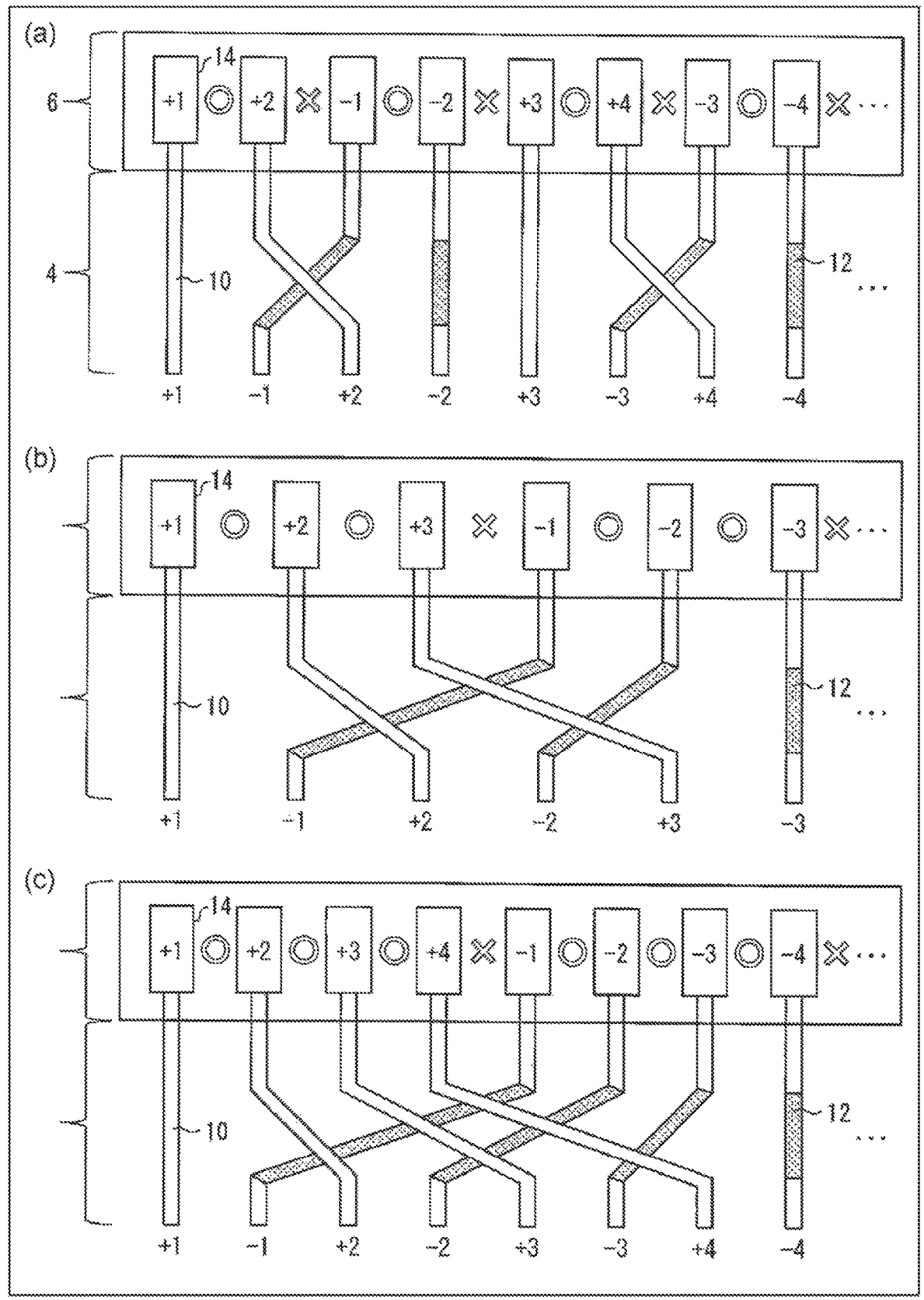
FIG. 17 provides schematic diagrams of a wiring area and an external connection terminal of a display device according to Embodiment 5 of the disclosure for respectively explaining examples of a wiring structure of the display device and a method of applying image signals.

FIG. 17 provides enlarged schematic diagrams of the wiring area 4 and the external connection terminal 6 of the display device DD according to Embodiment 5 of the disclosure for each explaining a wiring structure of the display device DD and a method of applying image signals. The display device DD according to this embodiment differs from the display device DD according to Embodiment 1 in that, the electrodes 14 are arranged as only one level.

As illustrated in FIG. 17(*a*), in the electrodes 14 of the external connection terminal 6 of the display device DD according to this embodiment, image signals of positive or negative polarity may be alternately applied to every two electrodes. In this case, as compared to the case in which an image signal of positive or negative polarity is applied alternately to every one electrode, it is possible to reduce pairs of electrodes to which image signals of different polarities are applied.

Similarly, as illustrated in FIGS. 17(*b*) and 17(*c*), in the electrodes 14 of the external connection terminal 6 of the display device DD according to this embodiment, image signals of positive or negative polarity may be applied alternately to every three or four electrodes. In this case, it is possible to further reduce pairs of electrodes to which image signals of different polarities are applied. When N is an integer, in the case in which an image signal of positive or negative polarity is applied alternately to every N electrodes, it is possible to decrease pairs of electrodes to which image signals of different polarities are applied to 1/N.

As illustrated in FIGS. 17(a) to 17(c), in any case described above, wires are routed in the wiring area 4 such that the polarities of image signals transmitted to wires adjacent to each other in the display area 2 are different from each other. At this time, similarly to the display device DD according to the embodiment described previously, wires to which image signals of different polarities are transmitted may cross each other as appropriate.

In the display device DD according to this embodiment, for example, COG, COF-FOG, COP, COF-FOP, or OLB may be employed as a method of installing the external connection terminal 6.

Embodiment 6

FIG. 18 provides schematic diagrams for explaining the shape of electrode and a method of arranging electrodes of an external connection terminal of a display device DD according to Embodiment 6 of the disclosure. FIG. 18(a) provides a schematic top view of the external connection terminal 6 of the display device DD according to Embodiment 1. FIG. 18(b) provides a schematic top view of the external connection terminal 6 of the display device DD according to this embodiment and FIG. 18(c) provides a schematic top view of the external connection terminal 6 of the display device DD according to another example of this embodiment.

In comparison to the external connection terminal 6 of the display device DD according to Embodiment 1, in the external connection terminal 6 of the display device DD according to this embodiment illustrated in FIG. 18(b), the shape of each of the electrodes 14 is smaller in the transverse direction and larger in the longitudinal direction. This means that the shape of the electrode 14 is small in a direction in which electrodes to which image signals of different polarities are transmitted exist and the shape of the electrode 14 is large in a direction in which electrodes to which image signals having the same polarity are transmitted exist. As a result, the distance between an end of one electrode 14 and an end of another electrode 14 adjacent to the one electrode 14 is longer in the transverse direction and shorter in the longitudinal direction in comparison to the electrode 14 according to Embodiment 1.

To the electrode 14, an image signal of polarity different from the polarity of the image signal applied to another electrode 14 adjacent to the electrode 14 in the transverse direction is applied. As a result, as the electrode 14 according to this embodiment, since the shape of the electrode 14 is small in the transverse direction, it is possible to increase the distance between a pair of electrodes to which image signals of different polarities are applied, and thus, it is possible to reduce the possibility that leakage current is caused between the electrodes.

By contrast, to the electrode 14, an image signal of a polarity identical to the polarity of the image signal applied to another electrode 14 adjacent to the electrode 14 in the longitudinal direction is applied. Thus, as the electrode 14 according to this embodiment, when the shape of the electrode 14 is enlarged in the longitudinal direction and the distance between a pair of electrodes to which image signals of identical polarities are applied is shortened, this structure does not largely affect the occurrence of leakage current between electrodes. As a result, since the shape of the electrode 14 is large in the longitudinal direction, when the shape of the electrode 14 is decreased in the transverse direction, the sufficient mounting area can be secured.

The external connection terminal 6 of the display device DD according to another example of this embodiment illustrated in FIG. 18(c) has the electrode 14 identical in shape to the electrode 14 of the external connection terminal 6 of the display device DD according to this embodiment illustrated in FIG. 18(b). In addition, in the external connection terminal 6 illustrated in FIG. 18(c), in comparison to the external connection terminal 6 illustrated in FIG. 18(b), the distance at which the electrodes 14 are formed is longer in the transverse direction and shorter in the longitudinal direction.

Since the distance at which the electrodes 14 are formed is longer in the transverse direction, due to the same reason as described above, it is possible to increase the distance between a pair of electrodes to which image signals of different polarities are applied, and thus, it is possible to reduce the possibility that leakage current is caused between the electrodes. Furthermore, since the distance at which the electrodes 14 are formed is shorter in the longitudinal direction, the shape of the external connection terminal 6 can be decreased in the longitudinal direction, and as a result, the area of the non-display area NA of the display device DD can be reduced, resulting in narrowing the frame of the display device DD.

CONCLUSION

A display device of aspect 1 includes a display area having a plurality of pixels, a wiring area in which a plurality of wires corresponding to the plurality of pixels are arranged, and an external connection terminal having a plurality of electrodes to which image signals to be transmitted to the plurality of wires are applied. In the display device, polarities of the image signals transmitted to wires adjacent to each other among the plurality of wires are different from each other in the display area. In the display device, the order of arrangement of the plurality of electrodes is different from the order of the image signals transmitted to the plurality of wires of the display area.

In aspect 2, among the plurality of wires, the wires to which the image signals of different polarities are transmitted cross each other in the wiring area.

In aspect 3, the image signals of identical polarities are applied repeatedly a plurality of times to one group of electrodes of the plurality of electrodes. The electrodes of the one group are formed at positions identical to each other in a direction in which the plurality of wires extend.

In aspect 4, the plurality of electrodes are arranged in a staggered arrangement of an odd number of levels.

In aspect 5, the plurality of electrodes are arranged in a staggered arrangement of an even number of levels.

In aspect 6, the shape of each of the plurality of electrodes is smaller in a direction in which electrodes of the plurality of electrodes to which the image signals of different polarities are transmitted exist, as compared to a direction in which electrodes of the plurality of electrodes to which the image signals of identical polarities are transmitted exist.

In aspect 7, the distance between the plurality of electrodes is longer in a direction in which electrodes of the plurality of electrodes to which the image signals of different polarities are transmitted exist, as compared to a direction in which electrodes of the plurality of electrodes to which the image signals of identical polarities are transmitted exist.

In aspect 8, the plurality of wires includes a first wire and a second wire in a layer different from a layer of the first wire.

In aspect 9, the first wire and the second wire cross each other in the wiring area.

In aspect 10, the layer of the first wire is identical to a layer of gate electrodes of transistors corresponding to the plurality of pixels in the display area.

In aspect 11, the layer of the second wire is identical to a layer of source electrodes of transistors corresponding to the plurality of pixels in the display area.

In aspect 12, the plurality of wires further includes a third wire in a layer different from the layer of the first wire and the layer of the second wire.

In aspect 13, the third wire crosses the first wire or the second wire.

In aspect 14, the plurality of wires in the external connection terminal are in a layer identical to the layer of the third wire.

In aspect 15, each of the plurality of electrodes is in a layer identical to the layer of the third wire.

In aspect 16, the plurality of wires further includes a fourth wire in a layer different from the layer of the first wire, the layer of the second wire, and the layer of the third wire.

In aspect 17, the fourth wire crosses the first wire or the second wire.

In aspect 18, the plurality of wires in the external connection terminal are in a layer identical to the layer of the fourth wire.

In aspect 19, each of the plurality of electrodes is in a layer identical to the layer of the fourth wire.

The disclosure is not limited to the embodiments described above and various changes can be made within the scope described in the claims, Embodiments constituted by any combination of technical means disclosed in the different embodiments are embodied in the scope of the disclosure. Furthermore, by combining technical means disclosed in the embodiments with each other, a novel technical feature may be formed.

REFERENCE SIGNS LIST 2 display area
4 wiring area
6 external connection terminal
8 pixel
10 first wire
12 second wire
14 electrode
28 third wire
30 fourth wire

The invention claimed is:

1. A display device comprising:
a display area having a plurality of pixels;
a wiring area in which a plurality of wires corresponding to the plurality of pixels are arranged; and
an external connection terminal having a plurality of electrodes to which image signals to be transmitted to the plurality of wires are applied, wherein
polarities of the image signals transmitted to wires adjacent to each other among the plurality of wires are different from each other in the display area, and
an order of arrangement of the plurality of electrodes is different from an order of the image signals transmitted to the plurality of wires of the display area,
wherein the plurality of wires includes a first wire and a second wire in a layer different from a layer of the first wire, and
the layer of the first wire is identical to a layer of gate electrodes of transistors corresponding to the plurality of pixels in the display area.

2. The display device according to claim 1, wherein, among the plurality of wires, the wires to which the image signals of different polarities are transmitted cross each other in the wiring area.

3. The display device according to claim 1, wherein the image signals of identical polarities are applied repeatedly a plurality of times to one group of electrodes of the plurality of electrodes, the electrodes of the one group being formed at positions identical to each other in a direction in which the plurality of wires extend.

4. The display device according to claim 1, wherein the plurality of electrodes are arranged in a staggered arrangement of an odd number of levels.

5. The display device according to claim 1, wherein the plurality of electrodes are arranged in a staggered arrangement of an even number of levels.

6. The display device according to claim 1, wherein a shape of each of the plurality of electrodes is smaller in a direction in which electrodes of the plurality of electrodes to which the image signals of different polarities are transmitted exist, as compared to a direction in which electrodes of the plurality of electrodes to which the image signals of identical polarities are transmitted exist.

7. The display device according to claim 1, wherein a distance between the plurality of electrodes is longer in a direction in which electrodes of the plurality of electrodes to which the image signals of different polarities are transmitted exist, as compared to a direction in which electrodes of the plurality of electrodes to which the image signals of identical polarities are transmitted exist.

8. The display device according to claim 1, wherein the first wire and the second wire cross each other in the wiring area.

9. The display device according to claim 1, wherein the layer of the second wire is identical to a layer of source electrodes of transistors corresponding to the plurality of pixels in the display area.

10. The display device according to claim 1, wherein the plurality of wires further includes a third wire in a layer different from the layer of the first wire and the layer of the second wire.

11. The display device according to claim 10, wherein the third wire crosses the first wire or the second wire.

12. The display device according to claim 10, wherein the plurality of wires in the external connection terminal are in a layer identical to the layer of the third wire.

13. The display device according to claim 10, wherein each of the plurality of electrodes is in a layer identical to the layer of the third wire.

14. The display device according to claim 10, wherein the plurality of wires further includes a fourth wire in a layer different from the layer of the first wire, the layer of the second wire, and the layer of the third wire.

15. The display device according to claim 14, wherein the fourth wire crosses the first wire or the second wire.

16. The display device according to claim 14, wherein the plurality of wires in the external connection terminal includes a member identical to the fourth wire.

17. The display device according to claim 14, wherein each of the plurality of electrodes includes a member identical to the fourth wire.

\* \* \* \* \*